United States Patent
Ramkumar et al.

(10) Patent No.: US 6,399,462 B1
(45) Date of Patent: *Jun. 4, 2002

(54) METHOD AND STRUCTURE FOR ISOLATING INTEGRATED CIRCUIT COMPONENTS AND/OR SEMICONDUCTOR ACTIVE DEVICES

(75) Inventors: Krishnaswamy Ramkumar, San Jose; Sang S. Kim, Laguna Hills; Sharmin Sadoughi, Cupertino; Pamela Trammel; Avner Shelem, both of San Jose, all of CA (US)

(73) Assignee: Cypress Semiconductor Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/885,046

(22) Filed: Jun. 30, 1997

(51) Int. Cl.[7] .............................................. H01L 21/76
(52) U.S. Cl. .................... 438/439; 438/297; 438/424; 438/425
(58) Field of Search ................ 438/424–439, 438/297

(56) References Cited

U.S. PATENT DOCUMENTS

| | | | |
|---|---|---|---|
| 4,983,537 A | * 1/1991 | Wei | 438/425 |
| 5,208,168 A | * 5/1993 | Parrillo et al. | 438/297 |
| 5,393,693 A | * 2/1995 | Ko et al. | 438/297 |
| 5,470,770 A | * 11/1995 | Takahashi et al. | 438/297 |
| 5,504,034 A | * 4/1996 | Rapisarda | 438/435 |
| 5,696,022 A | * 12/1997 | Jang et al. | 438/439 |
| 5,719,085 A | * 2/1998 | Moon et al. | 438/424 |
| 5,747,376 A | * 5/1998 | Lee | 438/443 |

(List continued on next page.)

OTHER PUBLICATIONS

Stanley Wolf Silicon Processing for the VSLI ERA vol. 2 Lattice Press pp. 31 and 53, 1990.*
N. Shimizu et al.. "A Poly–Buffer Recessed LOCOS Process for 256Mbit DRAM Cells", *IEDM 92 Tech Digest*, pp. 279–282 (1992).
B. Davari et al., "A Variable–Size Shallow Trench Isolation (STI) Technology with Diffused Sidewall Doping for Sub-micron CMOS", *IEDM 88 Tech Digest*, pp. 92–95 (1988).
Pierre C. Fazan and Viju K. Mathews, "A Highly Manufacturable Trench Isolation Process for Deep Submicron DRAMs", *IEDM 93 Tech Digest.*, pp. 57–60 (1993).
Viju K. Mathews et al.., "Dry $O_2$ High Pressure Field Oxidation for 0.25 $\mu$m Isolation Technology", *Extended Abstracts of the 1995 International Conference on Solid State Devices and Materials*, pp. 899–901 (1995).

(List continued on next page.)

*Primary Examiner*—Olik Chaudhuri
*Assistant Examiner*—David S Blum
(74) *Attorney, Agent, or Firm*—Brinks Hofer Gilson & Lione

(57) ABSTRACT

A method of forming a field oxide or isolation region in a semiconductor die. A nitride layer (over an oxide layer disposed over a substrate) is patterned and subsequently etched so that the nitride layer has a nearly vertical sidewall. The oxide layer and the substrate in the isolation region are etched to form a recess in the substrate having a sloped surface with respect to the nearly vertical sidewall of the nitride layer. A field oxide is then grown in the recess using a high pressure, dry oxidizing atmosphere. The sloped sidewall of the substrate effectively moves the face of the exposed substrate away from the edge of the nitride layer sidewall. Compared to non-sloped techniques, the oxidation appears to start with a built-in offset from the patterned etch. This leads to a reduction of oxide encroachment and a nearly non-existent bird's beak. The desirable range of slopes for the substrate sidewall is approximately 50°–80° with respect to a nearly planar surface of the substrate in the recess.

17 Claims, 6 Drawing Sheets

U.S. PATENT DOCUMENTS 5,780,346 A * 7/1998 Arghavani et al. .......... 438/296
5,807,784 A * 9/1998 Kim ........................... 438/425
5,851,901 A * 12/1998 Gardner et al. ............. 438/439

OTHER PUBLICATIONS

A. L. Esquivel and Sang S. Kim, "Advantages of Using Dry Oxygen, High Pressure Oxidation for Sub–0.5μm CMOS Isolation", *Extended Abstracts: 188th Electrochemical Society Meeting*, vol. 95–2, No. 524 pp. 839–840 (1995).

S. Deleonibus et al., "A High Pressure Temperature Poly Buffer LOCOS (HP–HTPBL) Isolation Process for 1Gbit Density Non Volatile Memories", *International Conferences on Solid State Devices and Materials*, pp. 893–895 (1995).

K. Tsukamoto et al. "High Pressure Oxidation for Isolation for Isolation of High Speed Bipolar Devices", International Electon Devices Meeting Technical Digest, pp. 340–343, (1979).

Franz, G. and Hartmann, W., Appl. Phys. Len. 37(11), Dec. 1, 1980, "Real–Time x–ray topography studies of the viscoelastic behavior of $SiO_2$ in the system $Si/SiO_2$," p. 1004–1005.

Kolbesen, B.O. and Strunk, H., Inst.Phys.Conf.Ser.No. 57, "Process–induced defects in silicon," p. 21–50 no date.

* cited by examiner

PATTERN AND ETCH NITRIDE LAYER

ETCH INTO Si

GROW ISOLATION OXIDE AND REMOVE NITRIDE LAYER

METHOD AND STRUCTURE FOR ISOLATING INTEGRATED CIRCUIT COMPONENTS AND/OR SEMICONDUCTOR ACTIVE DEVICES

FIELD OF THE INVENTION

The present invention relates generally to a method of forming local oxidation isolation structures in semiconductor and/or integrated circuit devices and, more particularly, relates to a method of forming such isolation structures that reduces stress-related defects and that results in a reduced or negligible bird's beak.

BACKGROUND

All integrated circuits (ICs) have electric circuits which include a number of isolated devices, e.g., transistors, interconnected through one or more conducting paths. Thus, to fabricate ICs, the individual devices must be created in a silicon substrate in such a way that they are electrically isolated from one another. Isolation of the individual devices ensures that the state (e.g., on or off) and conductance of the individual devices are independently controlled. Without proper isolation, leakage currents may occur, causing power dissipation, noise margin degradation and/or voltage shifts on dynamic nodes. In CMOS circuits, leakage currents may lead to device latch up, which can damage the integrated circuit. Further, without proper isolation, cross-talk between devices may occur, thereby disturbing the logic state of a gate which is made up of a number of the individual devices.

Integrated circuit designers face other challenges that may conflict with the desire for proper isolation. For example, it is commercially important to make the spacing between individual components or devices as small as possible to enable increases in device density (e.g., number of devices per unit area). Furthermore, there is a strong desire in the art to ensure that the fabrication processes which are used to produce the isolation structures are simple to implement and control while, at the same time, these processes should not adversely impact the characteristics of active areas of the semiconductor die which will form the integrated circuit.

To meet these and other challenges in manufacturing semiconductor devices, Local Oxidation of Silicon (LOCOS) has become a widely used processing step in forming lateral isolation structures between devices (e.g., transistors) on a semiconductor die. Indeed, the LOCOS process has become the "work horse" isolation technology for MOS devices down to about 0.5 $\mu$m geometries. LOCOS processes are popular, in part, because they produce a fairly planar surface which is highly desirable for resolving and patterning dense features on a semiconductor die.

FIG. 1 illustrates a semiconductor die 10 at one stage of a conventional LOCOS process. A thin layer of a pad oxide of approximately 10 to 50 nm thickness is formed on the surface of a silicon substrate 12. Next, a thicker layer of silicon nitride 16 is deposited on the pad oxide layer 14. The silicon nitride layer 16 may be approximately 100 to 150 nm thick and may be deposited using conventional chemical vapor deposition (CVD) techniques.

In the resulting structure, the pad oxide layer 14 is used to cushion the transition of stresses between the silicon substrate 12 and the nitride layer 16. Such stresses may occur in the nitride layer 16 due to various effects, including: (1) a mismatch between the thermal co-efficient of expansion of the nitride layer 16 and the silicon substrate 12; and (2) a tendency of the growing field oxide (see below) to lift the edges of the nitride layer 16. Such stresses may cause the nitride layer 16 to crack as the field oxide layer is grown, thus defeating the purpose of the nitride layer 16 as an oxidation barrier.

Stresses may also be transmitted from the nitride layer 16 to the silicon substrate 12. These stresses may produce defects in the silicon crystal. In general, the thicker the pad oxide layer 14, the fewer the defects in both the nitride layer 16 and the silicon substrate 12 during the field oxide layer growth. However, a thick pad oxide layer 14 may render the nitride layer 16 less effective as an oxidation mask by allowing lateral oxidation to take place. Consequently, the thinnest pad oxide layer 14 that effectively relieves stress is generally employed.

After the nitride layer 16 is deposited, it may be patterned, for example by using conventional photolithography techniques wherein in a photoresist layer (not shown) is spun on and exposed though a mask. As shown in FIG. 2, the nitride layer 16 and pad oxide layer 14 may then be etched to expose a top surface of the silicon substrate 12 in a region 18 that will become an isolation structure. In other words, the nitride layer 16 and pad oxide layer 14 are patterned so that after the etch they remain only over what will become the active regions in the silicon substrate 12.

With the region 18 still exposed, the silicon substrate 12 is oxidized to form a field oxide region 20 of desired thickness. The result is shown in FIG. 3 where a field oxide region 20 has been grown over silicon substrate 12. Even though this oxide grows mainly in areas where the silicon nitride layer 16 is absent, the oxide generally grows by diffusion, resulting in both vertical growth in the isolation region and lateral growth under the nitride and pad oxide layers, 16 and 14. This lateral growth of the field oxide results in a so-called bird's beak, because the shape of the oxide grown under the nitride layer resembles that of a bird's beak. Because it is the beak-to-beak distance "b" (see FIG. 4) over the silicon substrate 12 which will define the active transistor area, the smaller the bird's beak, the closer devices (e.g., transistors) can be packed onto a given substrate. In other words, bird's beak encroachment leads to active areas that are narrower than originally patterned. What is desired is as small a bird's beak as possible.

Because of the bird's beak phenomenon, conventional LOCOS processes are generally considered most appropriate for technologies having transistor gate widths of approximately 0.5 $\mu$m, or greater. That is, it has been recognized in the literature (see, e.g., Stanley Wolf, Silicon Processing for the VLSI Era, Vol. 3, Ch. 6, p. 367) that conventional LOCOS technologies are not suitable for device geometries of less than 0.5 $\mu$m. To overcome this barrier, some variations of conventional LOCOS have been proposed which attempt to minimize the bird's beak effect. For example, techniques such as sidewall masked isolation and poly-buffered LOCOS have been developed to reduce the effect of bird's beak. In general, however, these techniques typically require additional processing steps, therefore making the processes more complex and more costly. Another drawback of conventional LOCOS is that it is susceptible to "defects" caused by the high stresses generated in the narrow active areas, underneath the nitride layer, during the field oxidation. These defects can degrade the gate oxide quality and transistor performance. The defect generation gets enhanced as the geometries shrink and the bird's beak encroachment becomes more significant. What is desired, therefore, is a means of forming an isolation structure in a semiconductor substrate having a reduced bird's beak that does not have the drawbacks and shortcomings of conventional methods and/or known variations thereof.

SUMMARY OF INVENTION

The present invention concerns a method of forming an isolation region in a semiconductor wafer or die. The semiconductor die generally includes a semiconductor (preferably silicon) substrate, an oxide layer thereon and a nitride layer on the oxide layer. The nitride layer is patterned to expose an isolation region, then subsequently etched so that a region of the nitride layer adjacent to the isolation region has a nearly vertical sidewall. The etch step may be continued or one or more separate etching steps may be conducted to etch the exposed oxide layer (i.e., in the isolation region) and a region having a sloped sidewall with respect to the nearly vertical sidewall of the nitride layer is formed in the silicon substrate. A field oxide is then grown in the isolation region using a high pressure, dry oxidizing atmosphere and/or environment. The high pressure dry ambient during oxidation results in reduced lateral oxidation.

The sloped sidewall of the silicon substrate in the isolation region effectively moves the face of the exposed silicon away from the edge produced by the patterning and etching of the nitride layer. When compared to a non-sloped sidewall region, the encroaching oxidation starts with a built-in offset from the patterning etch. This leads to a reduction of oxide encroachment and may result in a nearly non-existent bird's beak. The desirable range of slopes for the sidewall of the silicon substrate in the isolation region is approximately 50°–80° with respect to a horizontal plane defined by an approximately planar surface of the silicon substrate at the base of the isolation region (i.e., approximately 10°–40° with respect to the nitride layer sidewall).

The reduced oxide encroachment, due to the sloped sidewall and the high pressure dry oxidation, results in reduced stresses in the nitride and, hence, prevents the formation of defects in the underlying silicon. The dry ambient during oxidation also prevents KOOI defects (which may typically result from the interaction between the nitride and steam used in conventional oxidation).

BRIEF DESCRIPTION OF THE DRAWINGS

The present invention is illustrated by way of example, and not limitation, in the figures of the accompanying drawings in which.

DETAILED DESCRIPTION

The present invention provides a method of forming an isolation region in a semiconductor die. One object of the present method is to reduce bird's beak encroachment. The method is particularly suitable for VLSI and larger scale devices where circuits are densely packed on a semiconductor die. The present invention minimizes bird's beak encroachment of a local oxidation so that the space required for isolation regions between devices on a semiconductor die can be minimized. Although discussed with reference to specific illustrated embodiments, those skilled in the art will appreciate that the present invention may find application in a wide variety of semiconductor processes. Accordingly, the embodiments discussed below should be regarded as illustrative only and should in no way be read as limiting the scope of the present invention.

Figure 1:
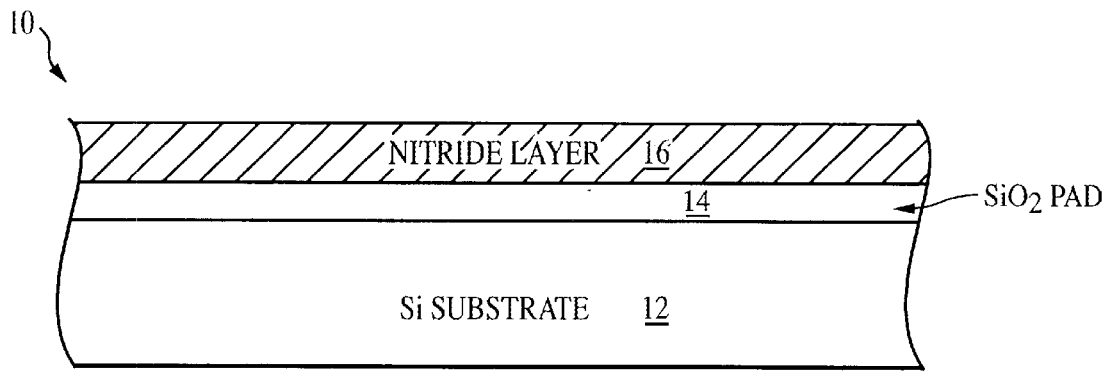
FIG. 1 illustrates a semiconductor die at an initial stage of a conventional LOCOS process.
Figure 2:
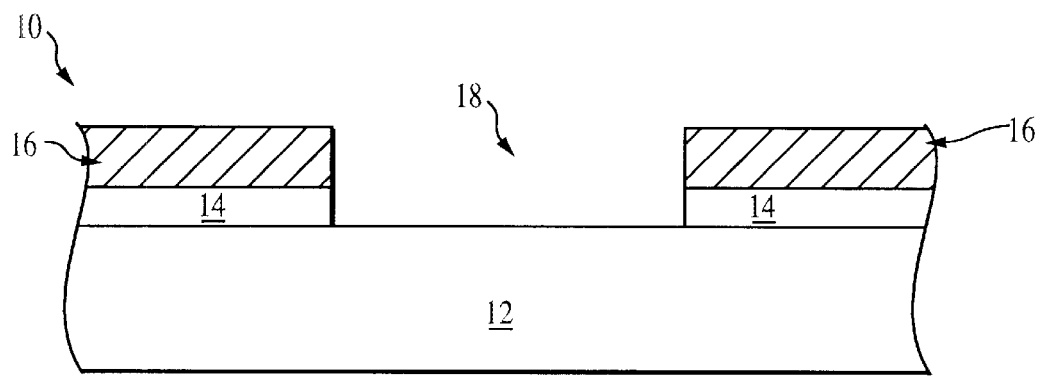
FIG. 2 illustrates the semiconductor die of FIG. 1 at a further stage of the conventional LOCOS process.
Figure 3:
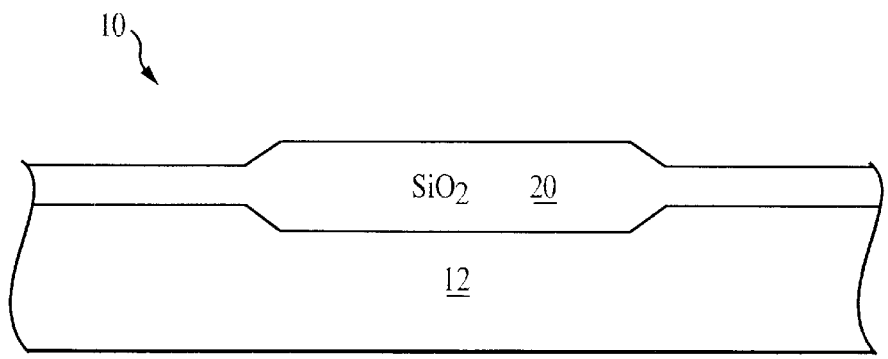
FIG. 3 illustrates the semiconductor die of FIG. 1 having an isolation region formed according to the conventional LOCOS process.
Figure 4:
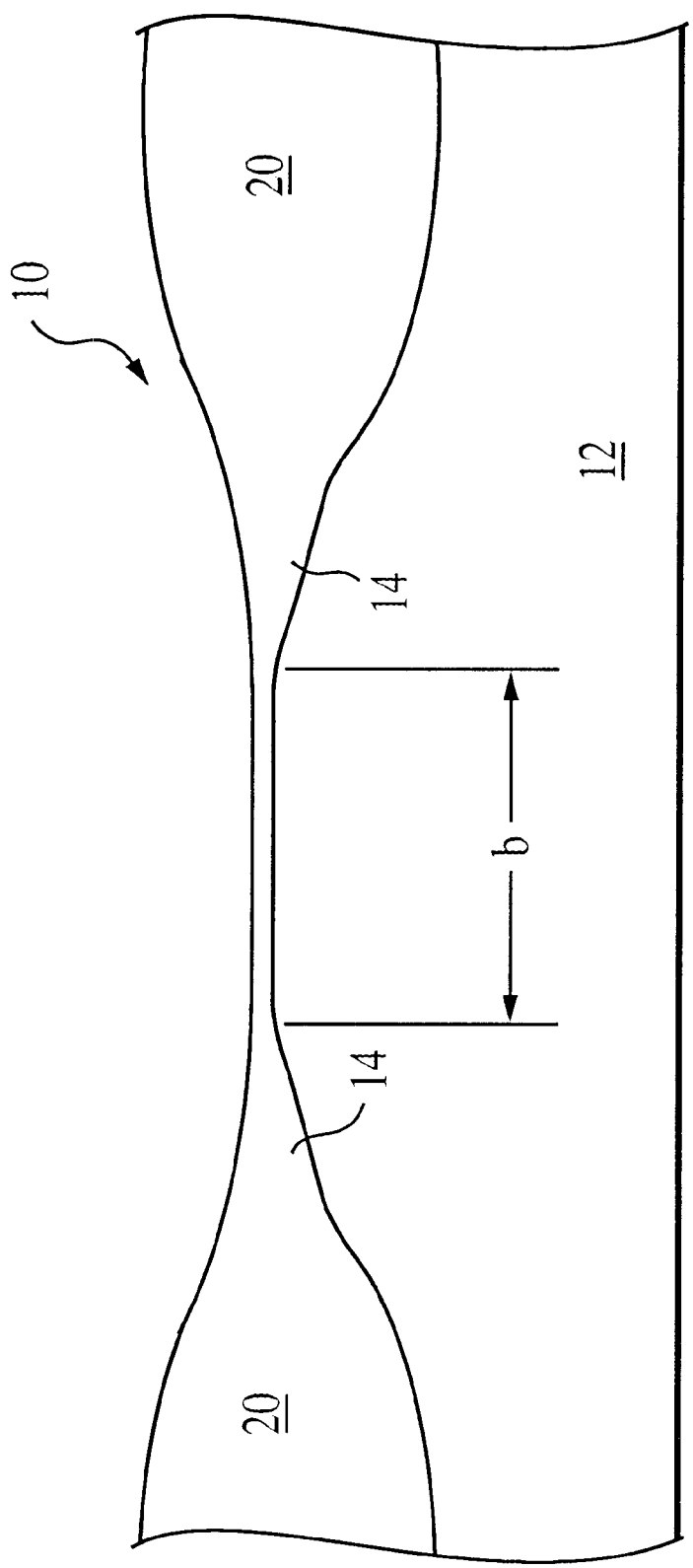
FIG. 4 illustrates a beak-to-beak distance between two isolation structures defining an active region in a semiconductor die.
Figure 5:
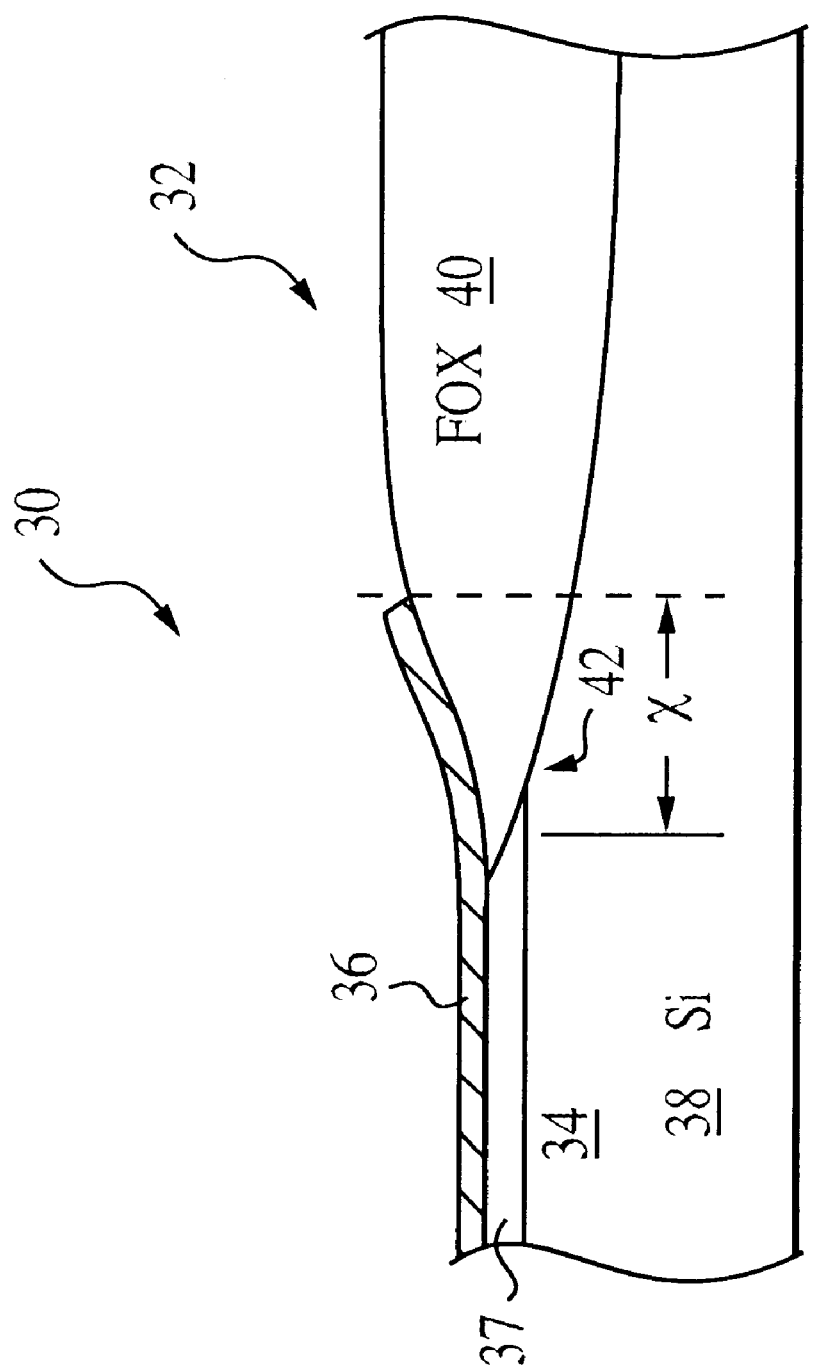
FIG. 5 illustrates the bird's beak phenomena experienced using the conventional LOCOS process.

FIG. 5 further illustrates the bird's beak phenomena introduced above. In the figure, a portion of a semiconductor die 30 at the boundary of an isolation region 32 and an active area 34 is shown. The semiconductor die 30 has been processed in accordance with conventional LOCOS techniques so that a nitride layer 36 (which was deposited over a pad oxide layer 37 disposed over silicon substrate 38) was patterned and etched to expose isolation region 32. Subsequently, the field oxide (FOX) layer 40 was grown under conventional oxide growth conditions. Field oxide layer 40 represents an isolation structure between active area 34 and an adjacent active area (not shown).

As can be seen from the illustration, during the growth of field oxide layer 40, oxidation occurs in both the vertical and horizontal directions. The result is that oxide encroached under nitride layer 36 (causing nitride layer 36 to ride up on the field oxide layer 40), forming a bird's beak 42. The present invention may find particular application in the reduction or elimination of these types of encroachments.

Figure 6A:
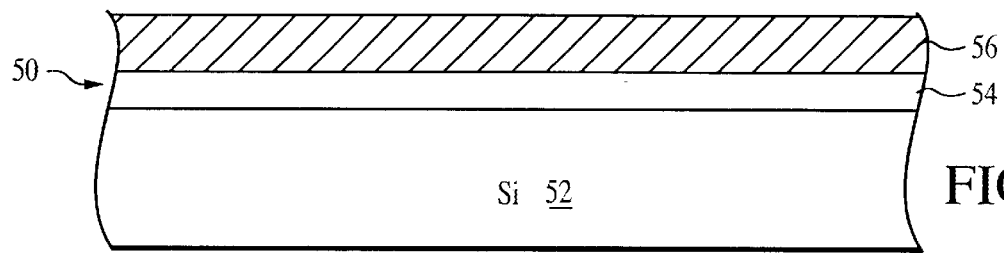
FIGS. 6a–6d illustrate the formation of an isolation region according to one embodiment of the present invention.

Referring to FIGS. 6a–6d, a processing sequence for a semiconductor die 50 according to one embodiment of the present invention is illustrated. Semiconductor die 50 includes a silicon substrate 52 and a layer 54 of pad oxide which has been grown over substrate 52, for example by thermal oxidation. The oxide layer 54 may or may not contain deposits such as boron, phosphorous, arsenic and/or a halogen (such as fluorine and/or chloride). Pad oxide layer 54 may be approximately 20 Å to 200 Å, preferably 30 Å to 150 Å, more preferably 50 Å to 100 Å thick, and acts as a stress buffer during the growth of the field oxide in a later process step. Also shown in FIG. 6a is a layer of silicon nitride 56 which has been deposited over the pad oxide layer 54, for example by conventional chemical vapor deposition techniques. The layer of silicon nitride 56 may be from 100 Å to 3000 Å, preferably 200 Å to 2000 Å, and more preferably from approximately 500 Å to 1500 Å thick. In specific embodiment, the nitride layer is about 1500 Å thick.

Figure 6B:
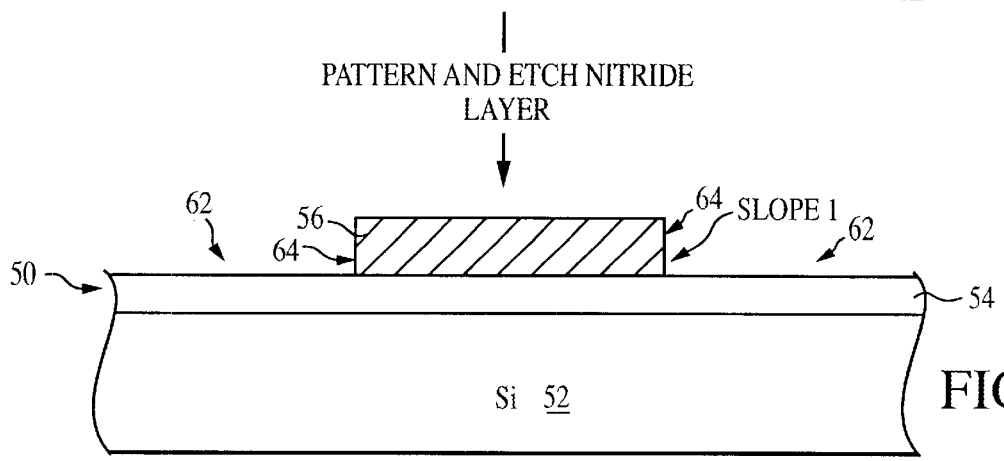

As shown in FIG. 6b, conventional lithography and plasma dry etching (or other similar) techniques are employed to pattern the nitride layer 56 to expose one or more isolation regions in the silicon substrate 52 where isolation structures are to be formed. These steps may be carried out by forming (e.g., by spinning on) and patterning (e.g., by irradiation through a photolithographic mask) a photoresist layer (not shown) in a conventional manner. The silicon nitride layer 56 is then removed from the isolation regions, for example, by a conventional dry etch process (e.g., using a process comprising a gas such as a halogenated (hydro)carbon compound and/or mixtures thereof, such as $C_nF_xH_y$, where n=1–4, preferably 1–2; $n \leq x \leq (2n+2)$, preferably $2n \leq x \leq (2n+2)$ and $0 \leq y \leq (n+2)$, preferably $0 \leq y \leq 2$; such that x+y=2n or 2n+2, preferably 2n+2).

Figure 6C:
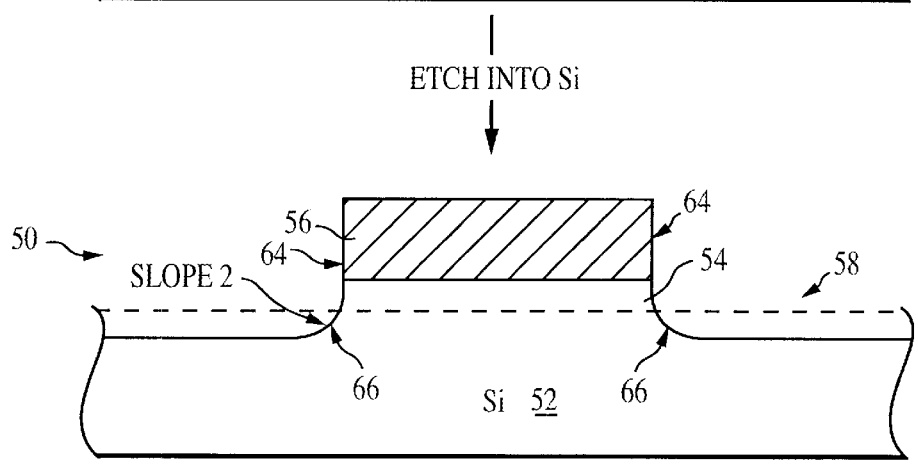

As shown in FIG. 6c, the etch may then be continued, optionally after changing the etch chemistry to one suitable for etching SiO$_2$ to etch through the exposed pad oxide layer and expose the isolation regions of the substrate. If desired, the etchant(s) may again be changed to one(s) suitable and/or conventional for etching silicon, and the silicon substrate 52 is etched. The depth of the silicon etch may be from 100 Å to 1000 Å, preferably from 200 Å to 800 Å, more preferably from 250 Å to 750 Å. In one embodiment this depth is approximately 500 Å. The etch chemistries and conditions are used to produce different sidewall slopes (slope 1 and slope 2) for the nitride layer 56 and the silicon substrate 52 in the vicinity of the isolation regions. This results in a tapered recess 58 being formed in the silicon substrate 52. The tapered recess 58 has a sidewall with an angle β (see FIG. 7) of approximately 50°–80° with respect to the approximately horizontal plane of the silicon substrate 52 at the base of tapered recess 58 (thus, angle Ø is approximately 10°–40° with respect to the nearly vertical axis of the sidewall of the nitride layer 56). For example, the nitride sidewall may have an angle of 85° to 90° as measured from the substantially planar surface of the nitride layer. A more preferred angle β for the sidewall slope of the tapered recess 58 is in the range of 50° to 60° as measured from the horizontal axis of the silicon substrate at the base of the tapered recess 58.

The etching technique utilized for the silicon substrate in one embodiment of the present invention uses an etchant gas system of C$_2$F$_6$ and CHF$_3$ at a chamber pressure of from approximately 10 to approximately 2000 mtorr for a time of approximately 50 to 60 seconds. Other suitable etchant gases include SF$_6$, O$_2$, CF$_4$, C$_3$F$_8$, C$_2$H$_2$F$_4$ and C$_2$HF$_5$. Still other suitable etchant gas systems which use a fluorine- or chlorine-based chemistry may be used to achieve the same desirable results. However, the most preferred etchants for forming a sloped or tapered recess in the substrate include, at least in part, fluorocarbon- and/or hydrofluorocarbon-based etchants.

Figure 6D:
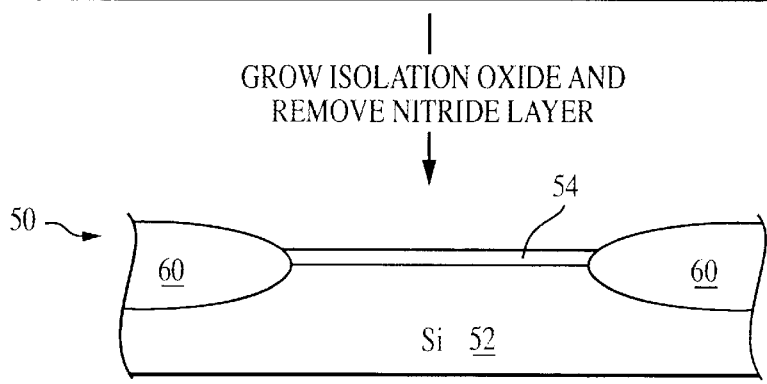

As shown in FIG. 6d, after the tapered recess 58 has been formed, a field oxide region 60 of from approximately 4000 Å–5000 Å is grown at a temperature of from 800° C. to 1200° C., preferably 850° C. to 1100° C. and in one embodiment approximately 1000° C. (e.g., 900° C.–1050° C.) for a time period sufficient to grow the field oxide to a thickness effective to electrically isolate adjacent active regions (e.g., from 60 to 180 min., preferably 90 to 150 min. and in a specific embodiment approximately 120 min.) in a dry atmosphere environment comprising a gaseous oxidant (e.g., O$_2$, O$_3$, H$_2$O$_2$, etc. that may further comprise an inert carrier gas such as H$_2$, He, Ar, etc.; preferably, the dry atmosphere comprises O$_2$). During this growth step, a chamber pressure of at least 5 atm, preferably at least 10 atm, and more preferably at least 15 atm (in a specific embodiment approximately 25 atm) is maintained. After the oxide is grown to a desired thickness, the silicon nitride layer 56 may be removed by conventional wet etching techniques.

In particular, FIG. 6b illustrates semiconductor die 50 after nitride layer 56 has been patterned and etched in accordance with the present invention, thereby leaving a sidewall 64 adjacent to an exposed isolation region 62. The sidewall 64 is preferably nearly vertical (e.g., having a slope of 85° to 90° relative to the horizontal surface of the nitride layer 56). In later processing steps (not shown), active areas (such as implant regions, transistor gates, interconnect structures and metal lines) may be formed in or on semiconductor die 50 in or over regions of silicon substrate 52 covered by the remaining regions of nitride layer 56. These active areas may be formed by conventional CMOS processing or other semiconductor and/or integrated circuit processing techniques.

In one embodiment, the etch which was started in FIG. 6b is continued to etch the pad oxide and, after changing the etch chemistry as described above, to etch the substrate. The result is the formation of one or more tapered recesses 58 in the silicon substrate 52. The tapered recesses 58 are formed in the isolation regions 62 which were exposed after the etch of the nitride layer 56 and/or pad oxide layer 54. Notice that the sidewall 66 of the tapered recess 58 has a different slope (slope 2) than the slope (slope 1) of the nearly vertical sidewall 64 of the of nitride layer 56.

After the silicon substrate 52 has been etched to the desired depth, the field oxide is grown in the isolation region (i.e., tapered recess 58). The oxide growth is carried out in a high pressure, dry oxidizing environment as discussed above. The method(s) of the present invention dramatically reduce bird's beak encroachment that may occur during a field oxide growing step.

During the oxidation of the silicon substrate 52, the volume of silicon oxide expands greatly from the corresponding unoxidized volume of silicon. The silicon oxide grows in the both the vertical and the horizontal directions at least in part because the gaseous oxidants diffuse through oxide to react with underlying silicon. In a preferred embodiment, during the oxidation process the silicon oxide expands less in the lateral direction due to the diffusion barrier properties of the nitride layer 56 on top of the silicon substrate 52. The nitride layer 56 therefore suppresses the lateral growth of the oxide. The lateral growth of the oxide under the nitride layer 56 may be limited when the oxidizing species is a dry oxidant such as oxygen and the oxidizing conditions include high pressure. Further, because of the sloped surface presented on the sidewall 66 of the silicon substrate layer 52, less silicon area is exposed to oxidant(s) than would ordinarily be the case. This also minimizes the lateral growth of the oxide under the nitride layer 56.

Figure 7:
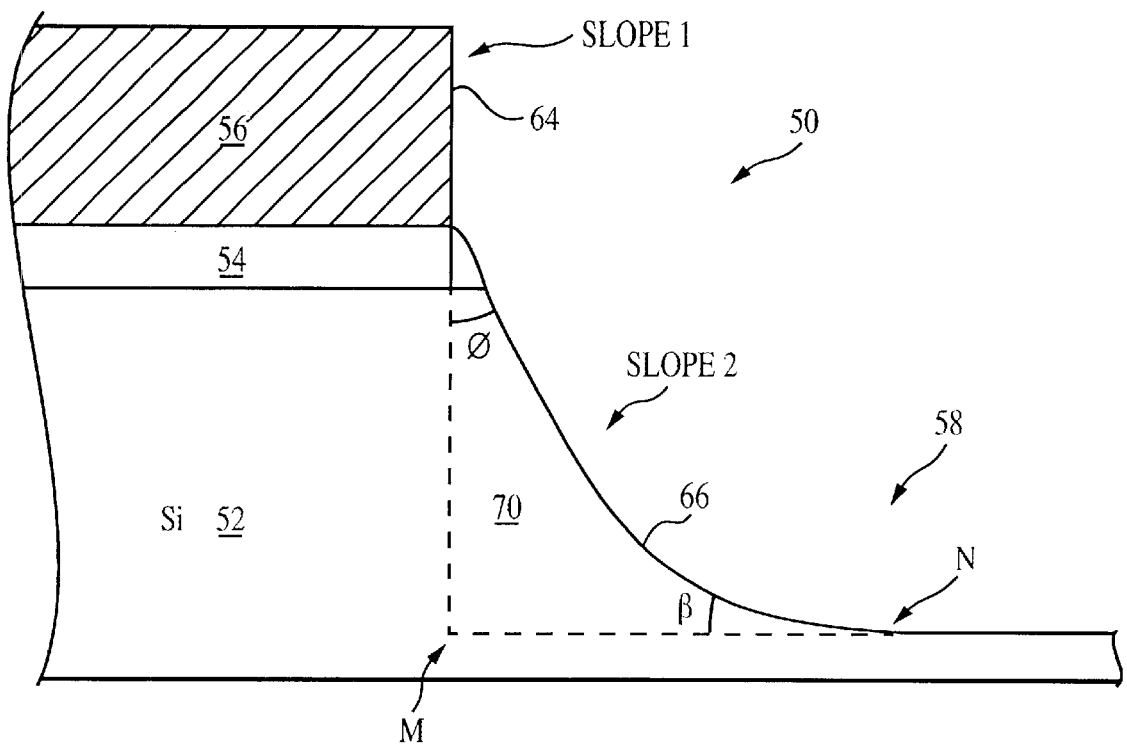
FIG. 7 highlights the sloped sidewall of the semiconductor substrate of the die illustrated in FIG. 6c.

FIG. 7 further illustrates this concept. As shown, the tapered recessed 58 in the silicon substrate 52 has a sloped sidewall 66. The sloped sidewall 66 forms an angle β with a horizontal axis as defined by the nearly planar surface of the silicon substrate 52 at the base of tapered recess 58. Preferably, β is between approximately 50° and approximately 80° and, more preferably, is between approximately 50° and 60°. If the LOCOS process had been performed according to conventional techniques, during oxidation, field oxide would begin growing at point M, the boundary between the nitride layer 56 and the silicon. However, during oxidation, field oxide may begin growing at point N in the tapered recess 58 provided by the present invention. In effect, the field oxide has been provided with an effective area 70 over which to grow during the oxidation step. The presence of this area 70 (which is not available in conventional LOCOS processing techniques) coupled with a relatively small lateral oxidation rate (as compared to vertical oxidation) for dry oxidants such as oxygen, reduces the encroachment of oxide under the nitride layer 56, thus dramatically reducing or eliminating bird's beak.

Figure 8:
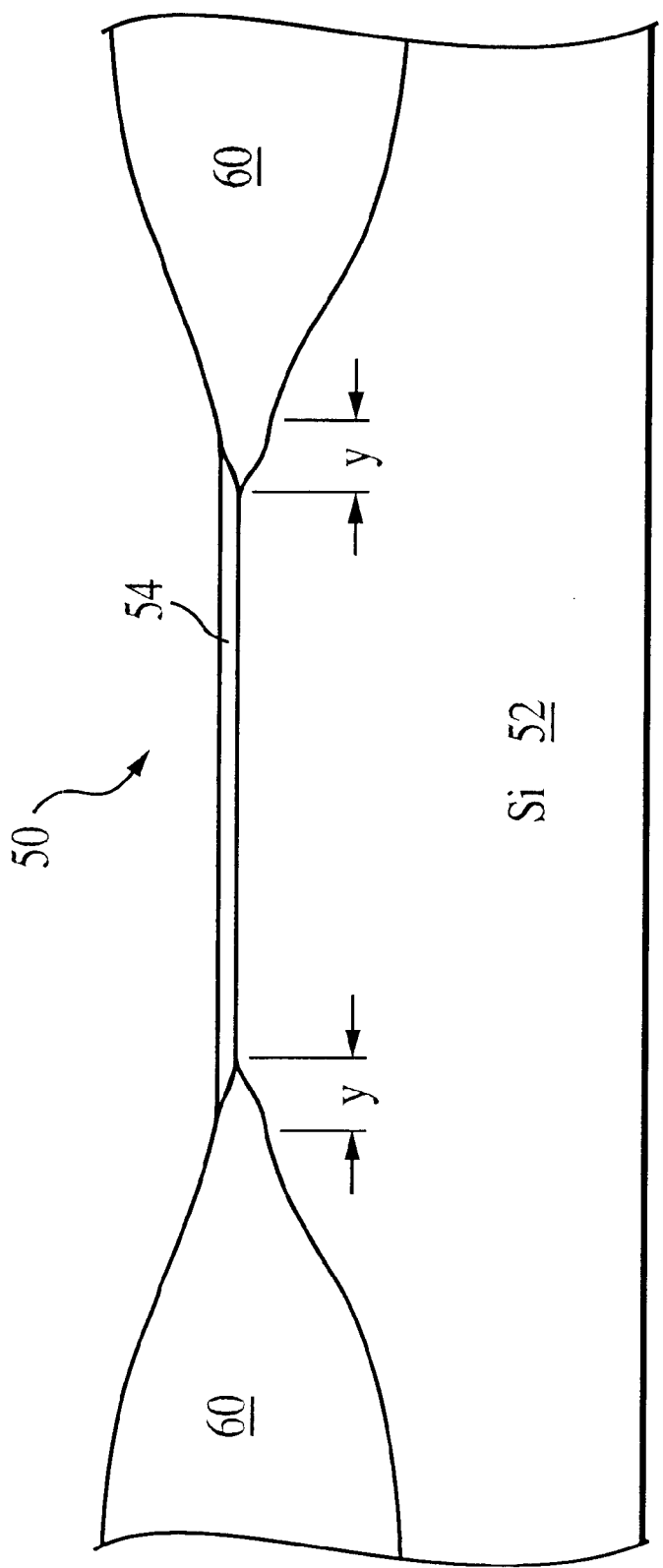
FIG. 8 illustrates the reduction in bird's beak archived according to one embodiment of the present invention.

The position difference between N and M can be expressed as $$\tfrac{1}{2}(A-B)$$

where A is a diameter of a circular photoresist opening for the masking step of the nitride layer 56 and B is the diameter of the base of the tapered recess opening. The starting point of oxidation in the tapered recess 58, i.e., the lowest point in the silicon 52, is therefore at an offset, i.e., ½(A–B), away from that in the vertical recess opening of the photoresist for the masking step of nitride layer 56. As a result, different lateral expansions are obtained in the tapered recess 58 using the methods of the present invention than would be obtained in a vertical recess opening using LOCOS methods of the past. The bird's beak length y, shown in FIG. 8, is therefore substantially less than the bird's beak length x shown in FIG. 5.

Representative results obtained using the processing methods of the present invention are illustrated in the electronmicrographs attached hereto as Appendix A. View A-1 shows a portion of a semiconductor die containing an active area (between the dashed vertical lines) bordered by two isolation structures fabricated in accordance with the present invention. The semiconductor die is a p-type substrate and a poly-silicon gate layer has been deposited over the substrate. In addition, an oxide layer has been deposited over the poly-silicon. As indicated by the scale of the view, the active region is a sub-one-half micron structure, yet there is a negligible bird's beak encroachment of the field oxide.

View A-2 is a further electronmicrograph of the same semiconductor die as shown in view A-1 at an adjacent active area. The isolation structure at the left of view A-2 is the same isolation structure shown at the right of view A-1. Notice again that there is negligible bird's beak encroachment into the active area.

For comparison purposes, presented in Appendix B are top-view electronmicrographs of similar structures produced in semiconductor dies using conventional LOCOS techniques and using the methods of the present invention. Views B-1, B-2 and B-3 are of a semiconductor die processed using conventional LOCOS techniques including conventional atmospheric pressures and wet oxidation. The oval-shaped structures near the center of each of these views are field oxide isolation regions. These regions are bordered by further isolation regions (shown near the top and bottom edges of views B-1, B-2 and B-3). Notice in each of these views that bird's beak structures extending from the isolation regions into the active areas are present. These appear as dark ring-like areas surrounding the oval-shaped isolation structures. Further, defects in the silicon are also present. The defects are the result of a combination of oxide growth in a wet oxygen (e.g., steam) environment (known in the art as KOOI defects) and stresses due to oxide encroachment. These defects cannot be removed from the silicon.

In contrast, views B-4 and B-5 represent the top-views of isolation structures formed in a semiconductor die in accordance with the present invention. Notice in each of these views that there has been a dramatic reduction in bird's beak encroachment into the active areas. In practice, a reduction in such encroachment of up to 90% over the encroachment observed when using conventional LOCOS techniques has been realized. Moreover, as shown in views B-4 and B-5, a high pressure, dry oxygen environment for the oxide growth has eliminated the KOOI and stress-related defects.

Thus, a novel method and structure for isolating integrated circuit components and/or semiconductor elements have been described. In the foregoing description, references were made to certain specific illustrated embodiments, however, those skilled in the art will appreciate that the present invention may be applied to a wide number of isolation structures in semiconductor dies and, accordingly the present in invention should be measured only in terms of claims which follow.

What is claimed is:

1. A method of forming a field oxide region in a semiconductor, comprising the steps of:
    etching a semiconductor comprising a silicon substrate having an oxide layer disposed thereover, said oxide layer having a nitride layer disposed thereover and having a first sidewall to form a recess having a second sidewall in said substrate, said second sidewall having a sloped surface with respect to said first sidewall; and
    growing a field oxide region in said recess in a high temperature, dry oxidizing environment at a pressure of at least 5 atm, whereby the field oxide fills the recess.

2. A method as in claim 1 wherein said step of growing a field oxide region is performed at a temperature of 850° C. to 1100° C.

3. A method as in claim 2 wherein said step of growing a field oxide region is performed for a length of time of from 60 to 180 minutes.

4. A method as in claim 1 wherein said step of growing a field oxide region is performed at a pressure of at least 10 atm.

5. A method as in claim 4 wherein said step of growing a field oxide region is performed at a temperature of 850° C. to 1100° C.

6. A method as in claim 5 wherein said step of growing a field oxide region is performed for a length of time from 60 to 180 minutes.

7. A method as in claim 1 wherein said step of growing a field oxide region is performed at a pressure of at least 15 atm.

8. A method as in claim 7 wherein said step of growing a field oxide region is performed at a temperature of 850° C. to 1100° C.

9. A method as in claim 8 wherein said step of growing a field oxide region is performed for a length of time from 60 to 180 minutes.

10. A method as in claim 1 wherein said step of etching comprises plasma etching with an etchant comprising a (hydro)carbon compound.

11. A method as in claim 1 wherein said step of etching comprises plasma etching with an etchant comprising a halogenated (hydro)carbon having 1–4 carbon atoms.

12. A method as in claim 1 wherein said step of etching comprises plasma etching with an etchant comprising a fluorinated (hydro)carbon having 1–4 carbon atoms.

13. A method as in claim 1 wherein said sloped surface has a slope of approximately 50°–80° with respect to a horizontal axis defined by a nearly planar surface of said substrate in said recess.

14. A method as in claim 1 further comprising prior to said etching step:
    forming said nitride layer over said oxide layer; and
    patterning and etching said nitride layer and said oxide layer.

15. A method as in claim 1 wherein said isolation region depth is from 100 Å to 1000 Å.

16. A method of forming a field oxide region in a semiconductor, comprising the steps of:
    etching a semiconductor comprising a silicon substrate having an oxide layer disposed thereover, said oxide layer having a nitride layer disposed thereover and having a first sidewall to form a recess having a second sidewall in said substrate, said second sidewall having a sloped surface with respect to said first sidewall; and
    growing a field oxide region in said recess in a high temperature, dry oxidizing environment at a pressure of at least 5 atm, whereby the field oxide fills the recess, wherein said nitride layer is 500 Å to 1500 Å thick.

17. A method of forming a field oxide region in a semiconductor, comprising the step of:
    growing a field oxide region in a recess, whereby the field oxide fills the recess;
    wherein said growing is at a temperature of 850 to 1100° C. and at a pressure of at least 5 atm, and
    said recess is in a structure comprising:
        a silicon substrate,
        an oxide layer on said silicon substrate, and
        a nitride layer on said oxide layer,
        wherein said recess is in said nitride layer, said oxide layer, and said silicon substrate, and
        a sidewall of said substrate defining said recess is sloped with respect to a sidewall of said nitride layer defining said recess.

* * * * *